US012270843B2

(12) United States Patent
Lofthouse et al.

(10) Patent No.: US 12,270,843 B2
(45) Date of Patent: *Apr. 8, 2025

(54) CALIBRATION OF THE EXTERNAL RESISTANCE VALUE IN THE POWER SOURCING EQUIPMENT OF A POWER OVER ETHERNET SYSTEM

(71) Applicant: Skyworks Solutions, Inc., Irvine, CA (US)

(72) Inventors: Sean A. Lofthouse, Austin, TX (US); James D. Austin, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 214 days.

This patent is subject to a terminal disclaimer.

(21) Appl. No.: 17/991,543

(22) Filed: Nov. 21, 2022

(65) Prior Publication Data

US 2023/0204641 A1 Jun. 29, 2023

Related U.S. Application Data

(63) Continuation of application No. 16/846,731, filed on Apr. 13, 2020, now Pat. No. 11,506,695.

(51) Int. Cl.
*G01R 27/08* (2006.01)
*H04L 12/10* (2006.01)

(52) U.S. Cl.
CPC ............... *G01R 27/08* (2013.01); *H04L 12/10* (2013.01)

(58) Field of Classification Search
CPC ........ G01R 27/00; G01R 27/02; G01R 27/08; G01R 1/00; G01R 1/20; G01R 1/203; G01R 35/00; G01R 35/005; H04L 12/00; H04L 12/02; H04L 12/10

USPC ....... 324/600, 601, 649, 691, 705, 500, 537, 324/750.01, 750.02; 702/85, 104
See application file for complete search history.

(56) References Cited

U.S. PATENT DOCUMENTS

| 9,746,436 | B2 | 8/2017 | Kubota |
| 10,551,468 | B2 | 2/2020 | Nishijima et al. |
| 11,262,388 | B2 | 3/2022 | Komatsu |
| 11,269,013 | B2* | 3/2022 | Ahn ...................... G01R 31/382 |
| 11,506,695 | B2 | 11/2022 | Lofthouse et al. |
| 2007/0164759 | A1 | 7/2007 | Bordelon |

(Continued)

FOREIGN PATENT DOCUMENTS

DE 102011103172 A1 * 12/2012 ............ B60T 13/741

OTHER PUBLICATIONS

NXP Semiconductors, "Current sense chain accuracy for the MC20XS4200 dual 24 v high-side switch family", Document No. AN5107, Rev. 1.0, Jul. 2016, 15 pages.

(Continued)

*Primary Examiner* — Hoai-An D. Nguyen
(74) *Attorney, Agent, or Firm* — Knobbe, Martens, Olson & Bear, LLP (57) ABSTRACT

A calibration operation determines a resistance of a sense resistor in a POE system. A voltage measurement is taken with a first current flowing through the sense resistor. A second voltage measurement is taken with a second current flowing through the resistor. A resistance value of the sense resistor is determined based on a voltage difference between the first and second voltage measurements and a current difference between the first current and the second currents.

20 Claims, 11 Drawing Sheets (56) References Cited

U.S. PATENT DOCUMENTS

| | | |
|---|---|---|
| 2009/0146681 A1 | 6/2009 | Jayapalan et al. |
| 2010/0127670 A1 | 5/2010 | Chen et al. |
| 2014/0244202 A1 | 8/2014 | Campi, Jr. et al. |
| 2022/0196750 A1* | 6/2022 | Sano .................. G01R 31/3648 |

OTHER PUBLICATIONS

Silicon Laboratories, "Quad IEEE 802.3 at POE PSE Controller", Si3454, Rev. 1.1, Sep. 2015, 57 pages.
Veracity, "Veracity white paper 002: POE explained", Version 1.1, Dec. 11, 2008, 14 pages.

* cited by examiner

CALIBRATION OF THE EXTERNAL RESISTANCE VALUE IN THE POWER SOURCING EQUIPMENT OF A POWER OVER ETHERNET SYSTEM

CROSS-REFERENCE TO RELATED APPLICATIONS

This application is a continuation of U.S. application Ser. No. 16/846,731, filed Apr. 13, 2020, entitled "CALIBRATION OF THE EXTERNAL RESISTANCE VALUE IN THE POWER SOURCING EQUIPMENT OF A POE SYSTEM." Each of the foregoing applications are incorporated herein by reference in their entirety.

BACKGROUND

Field of the Invention

This invention relates to calibration of a sense resistor used with power sourcing equipment (PSE) in power over ethernet (POE) applications.

Description of the Related Art

Power sourcing equipment (PSE) compliant with IEEE 802.3 provides power to a powered device (PD) over the Ethernet cables. The power sourcing equipment includes a smart controller that ensures that the power is provided safely. The PSE measures the output power and shuts off power if the load (the PD) is drawing too much power. In some applications, in order to be considered safe the power is limited to 100 W. In many implementations, a current sense resistor is used to measure power being supplied by the PSE to the PD.

Improvements in power measurement allow more precise control over the power being supplied to the PD.

SUMMARY OF EMBODIMENTS OF THE INVENTION

Accordingly, embodiments herein provide improved knowledge of the resistance value of the sense resistor to thereby improve the accuracy of power measurement. An accurate measurement of the resistance value of the sense resistor allows compensation for parasitic resistance, manufacturing variations of the resistor, and long term drift in the resistance value of the resistor. That allows accurate provision of maximum power levels.

In one embodiment, a method includes causing a first current to go through a sense resistor from a first current source and measuring a first voltage across the sense resistor resulting from the first current. The method further includes causing a second current to flow through the sense resistor from a second current source and measuring a second voltage across the sense resistor resulting from the second current. A resistance value of the sense resistor is determined based on a voltage difference between the first and second voltage and a current difference between the first current and the second current.

In another embodiment a method includes injecting a first current at a first node of a sense resistor from a first current source during a first time and injecting a second current at a second node of the sense resistor from a second current source during the first time, and measuring a first voltage across the sense resistor and parasitic resistance. The method further includes injecting a third current at the first node of the sense resistor from a third current source during a second time and injecting a fourth current at the second node of the sense resistor from a fourth current source during the second time and measuring a second voltage across the sense resistor and parasitic resistance. A resistance value of the sense resistor is determined, at least in part, based on a difference between the first voltage and the second voltage, and a current difference between the first current and the third current.

In another embodiment an apparatus includes a transistor having a drain node coupled to a port and a sense resistor coupled between a source node of the transistor and ground. A first current source is coupled to provide a first current to the sense resistor and a second current source is coupled to provide a second current to the sense resistor. An amplifier is coupled to a first node and a second node of the sense resistor to provide an indication of a first voltage across the sense resistor with the first current and to provide an indication of a second voltage across the sense resistor with the second current.

In another embodiment an apparatus includes a transistor having a first current carrying node coupled to a port. A sense resistor has a first node coupled to a second current carrying node of the transistor and a second node coupled to ground. A first current source supplies a first current at a first time to the sense resistor through the first node and a second current source supplies a second current to the second node at the first time. An amplifier circuit is coupled to the first node and the second node of the sense resistor to provide a first voltage measurement indicating a first voltage across the sense resistor at the first time. A third current source is coupled to supply a third current at a second time to the sense resistor through the first node and a fourth current source supplies a fourth current to the second node at the second time. The amplifier circuit provides a second voltage measurement indicating a second voltage across the sense resistor at the second time.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
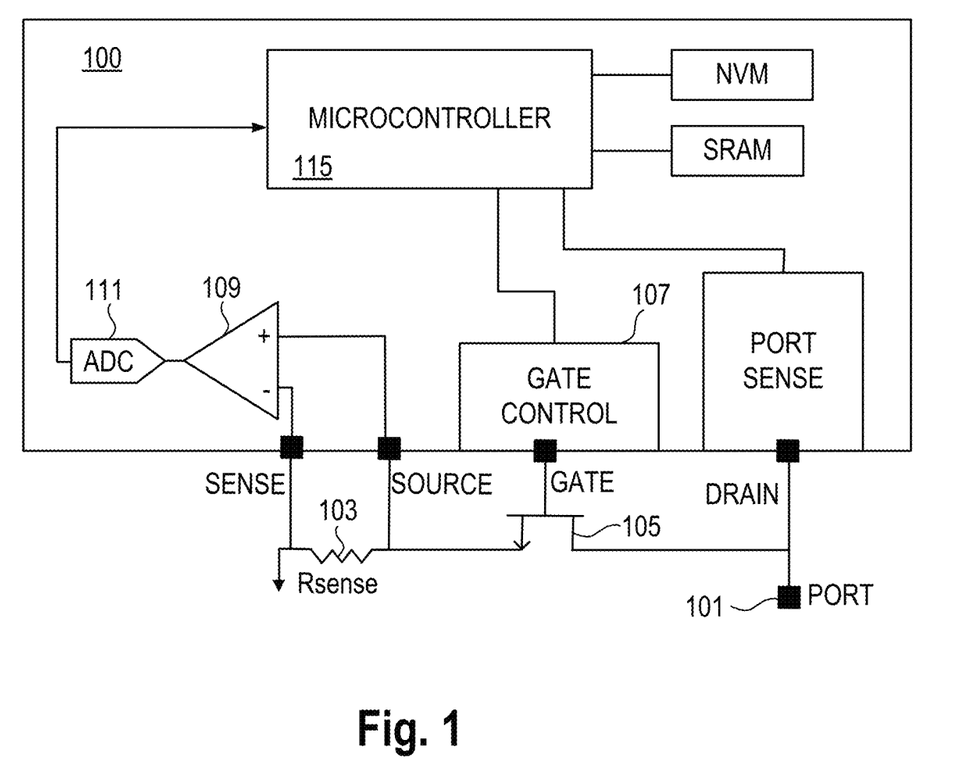
FIG. 1 illustrates a high level block diagram of a power sourcing equipment PSE.

FIG. 1 illustrates a high level block diagram of an integrated circuit 100 used in power sourcing equipment (PSE). The PSE provides power to a load (powered device) over port 101. The integrated circuit 100 measures the output power being supplied to the load using a sense resistor (Rsense) 103 and control logic in the PSE shuts off the power to the load if the load is drawing too much power. For example, in an embodiment the maximum power is limited to 100 W. The power measurement requires transistor 105 to be turned on by gate control logic 107. Amplifier 109 measures the voltage across the sense resistor 103 and supplies the analog measurement to analog to digital converter (ADC) 111. The ADC 111 supplies the digital value of the sensed voltage to microcontroller 115 (or other control logic), which determines whether the measured voltage corresponds to a current indicative of a safe power limit. Accurate knowledge (or lack thereof) of the resistance value of sense resistor 103 impacts the accuracy of the power measurement. A calibration measurement of the resistance value allows compensation for parasitic resistance, manufacturing variations of the resistor, and long term drift in the value of the resistor. That allows output of the maximum power levels with higher confidence. In addition, the approach described herein allows the use of lower cost, less accurate resistors, since the actual resistance value is measured.

Figure 2A:
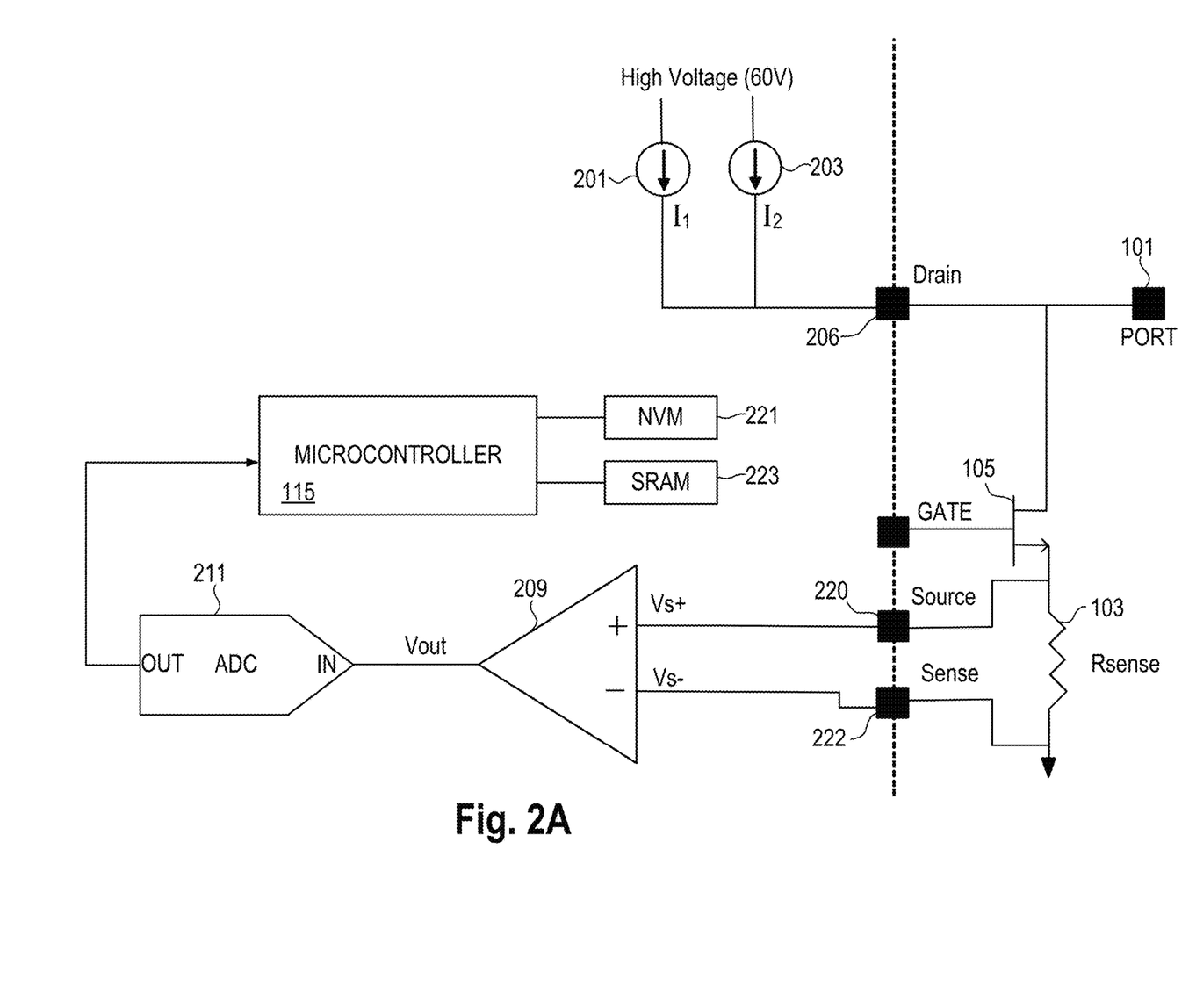
FIG. 2A illustrates a high level diagram of an embodiment of a calibration system to measure the sense resistor.

FIG. 2A illustrates a high level diagram of an embodiment of a calibration system used in a PSE embodiment to accurately measure the sense resistor 103. Two current sources 201 and 203 provide currents $I_1$ and $I_2$ to be used to determine the value of the sense resistor 103. In this embodiment, the current is injected at the drain terminal 206. The transistor 105 is turned on by gate control logic (not shown in FIG. 2A). In this embodiment, there is no load on port 101 during resistance measurement so as to not influence the measurement. The embodiment utilizes a two point measurement using the current sources. First the current $I_1$ from current source 201 is injected through the drain terminal 206 through transistor 105 and into the sense resistor 103. The differential amplifier 209 measures the voltage across the sense resistor as Vout=$V_{s+}-V_{s-}+V_{os}$, where $V_{s+}$ is the voltage sensed on the source terminal 220, $V_{s-}$ is the voltage on the sense terminal 222, and $V_{os}$ is the offset voltage associated with the differential amplifier. ADC 211 supplies the voltage measurement to the microcontroller 115 (or otherwise stores the voltage measurement). Then the current $I_2$ from current source 203 is supplied through the drain terminal 206 to the sense resistor 103 resulting in a second across the sense resistor. Differential amplifier 209 makes this second voltage measurement (Vout=$V_{s+}-V_{s-}+V_{os}$) and the second voltage measurement is stored. Because two voltage measurements are made, the resistance (R) of Rsense 103 can be determined by the difference in those voltage measurements. That is, $$R = \frac{\Delta V}{\Delta I},$$

where $\Delta V$ is the difference in the voltage measurements and $\Delta I$ is the difference in the currents. The value of the current sources can be determined during manufacturing testing and $\Delta I$ stored in non volatile memory (NVM) 221. In calculating the difference between the first and second voltage measurements, note that the offset voltage is canceled.

Since having the gain of the amplifier 209 known is important for accuracy, in an embodiment the gain of the amplifier is measured and stored and the stored gain value is used for appropriate compensation to provide greater accuracy in measuring the voltage value. In addition, the accuracy of the resistance measurement is limited by the resolution of the ADC, which should be chosen to meet desired accuracy. For the ADC implemented, it is desirable to use as much of the range of the ADC as possible in determining the resistance.

Figure 2B:
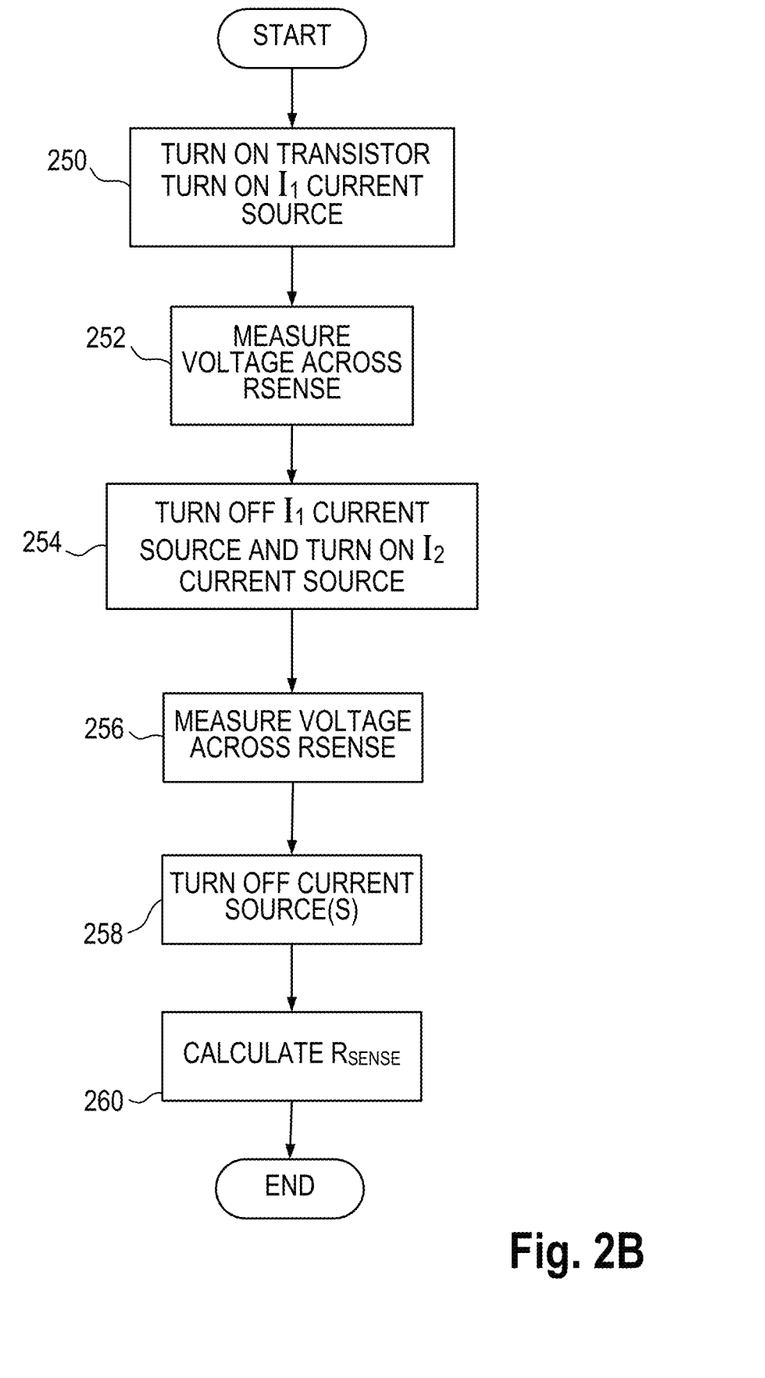
FIG. 2B illustrates a high level control flow of an embodiment of a calibration system to measure the sense resistor.

FIG. 2B illustrates a flow chart of the control sequence to measure the resistance value of sense resistor 103 in the embodiment of FIG. 2A while no load is attached to the port, e.g., during the initial production test of the PSE board. The programmed microcontroller 115 (or other dedicated control logic) controls the measurement sequence, including turning on the current sources at the appropriate times through control signals not illustrated in FIG. 2A, ensuring the transistor 105 is on during the voltage measurements, storing the digital values of the voltage supplied by the ADC 211, and making the calculations of Rsense. Such software can be stored in NVM 221 with the results stored in SRAM 223 (or other storage locations). The measurement sequence starts in 250 by turning on current source 201 and transistor 105 (if not already on). In 252, the differential amplifier 209 measures the voltage and the ADC 211 supplies the first measured voltage to the microcontroller directly or by storing the first measured voltage in a designated storage location. Next in 254, the sequence causes the $I_1$ current source to be turned off and the $I_2$ current source 203 to be turned on. In an embodiment, instead of a separate $I_2$ current source 203 being turned on, another $I_1$ current source 203 is turned on along with the $I_1$ current source 201 to provide for a current of $2I_1$. In step 256, the voltage across the resistance is measured and the result is supplied to the microcontroller 115 or otherwise stored. In 258 the current source(s) are turned off and in 260 the resistance is calculated as $$R_{sense} = \frac{\Delta V}{\Delta I},$$

where $\Delta I(I_2-I_1)$ is known. The value of Rsense is stored for use in power calculations by the PSE during runtime. However, the embodiment described in FIGS. 2A and 2B fail to account for the parasitic resistance involved in the resistance measurement, e.g., between the amplifier inputs and the sense resistor. Given that the sense resistor is small, e.g., 0.1Ω to 0.2Ω, the parasitic resistance involved in resistance measurements of the sense resistor can cause significant error.

Figure 3A:
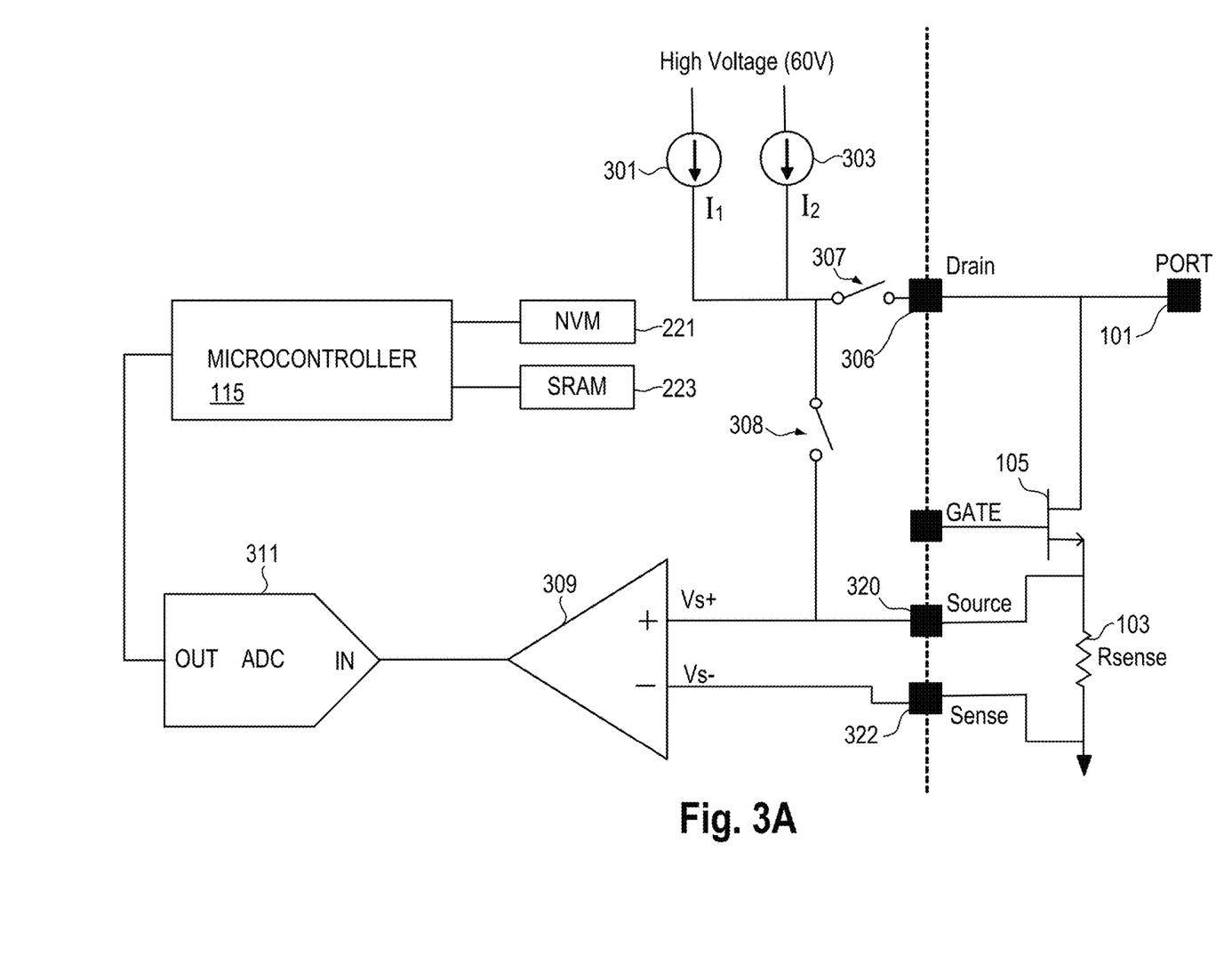
FIG. 3A illustrates an embodiment that determines parasitic resistance.

FIG. 3A illustrates one way of determining parasitic resistance associated with the measurement of Rsense. The embodiment of FIG. 3A includes current sources 301 and 303. The current sources connect to the drain terminal 306 through switch 307 and connect to the source terminal 320 through the switch 308. For the first measurement, switch 307 is closed and switch 308 is open. A two point measurement is performed to determine the resistance of Rsense 103. First the current source 301 is turned on and supplies the current $I_1$ through transistor 105 to the resistor 103 and the voltage is measured by amplifier 309 at nodes 320 and 322. Then the current source 303 supplies the current $I_2$ through transistor 105 to the resistor 103 and the voltage is measured by amplifier 309. The microcontroller or other control logic determines Rsense1=$\Delta V/\Delta I$. The first Rsense value (Rsense1) is saved, e.g., in SRAM 223 or in NVM 221. Next switch 307 is opened and switch 308 is closed. The transistor 105 is turned off. A second resistance measurement is made by first supplying the current $I_1$ to the source terminal 320 and measuring the voltage and storing the voltage measurement and then supplying the current $I_2$ to the source terminal 320 and measuring the voltage and storing the voltage measurement. The second resistance measurement Rsense2=$\Delta V/\Delta I$ with the current being injected at the source terminal 320. However, Rsense1 and Rsense2 will be different due to different current paths resulting in different resistance values of the sense resistor. Rsense2 for the source injection=Rsense+Rparasitic. Assuming the first measurement Rsense1 was just Rsense, the parasitic resistance with the source injection path can be determined as Rsense2-Rsense1. The parasitic value is saved and compensated for in future measurements. This is necessary during operation of the PSE since the only way to make measurements of Rsense in an operating PSE is to turn off transistor 105 using the gate control block to isolate the port from the sense resistor. All operational PSE Rsense measurements are made as Rsense2, and the parasitic resistance is subtracted from the operational Rsense2 measurements to calculate the Rsense value. Note that any changes in parasitic resistance due to drift or temperature can be estimated based on the percentage change in Rsense2 measurements as compared to the original Resense2 measurement obtained during board test.

The programmed microcontroller 115 controls the measurement sequence for determining the parasitic resistance, including turning on the current sources at the appropriate times, causing the switches to open and close as needed, ensuring the transistor 105 is on or off as needed during the voltage measurements, storing the digital values of the voltage supplied by the ADC 311, and making the calculations to determine Rsense1, Rsense2, and Rparastic. Software to control the operations to make the parasitic measurement can be stored in NVM 221 with the results stored in SRAM 223, NVM 221 (or other storage locations).

Figure 3B:
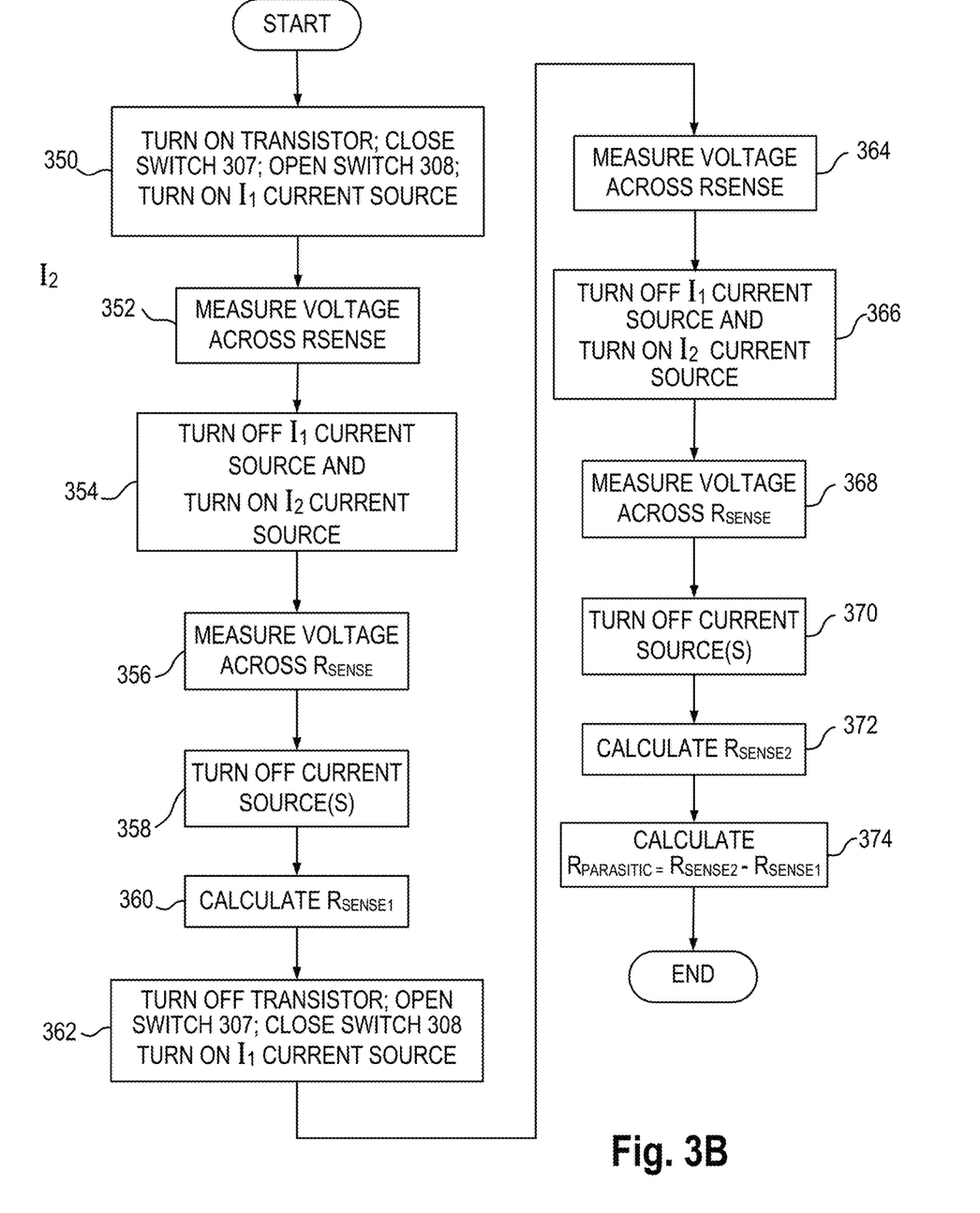
FIG. 3B illustrates a high level control flow of an embodiment of a calibration system to determine parasitic resistance associated with measuring the sense resistor.

FIG. 3B illustrates the control sequence to determine the parasitic resistance associated with measuring the resistance value of sense resistor 103 in the embodiment of FIG. 3A. The programmed microcontroller 115 (or other dedicated control logic) controls the sequence, including turning on the current sources at the appropriate times, ensuring the transistor 105 is on (or off) during the voltage measurements, storing the digital values of the voltage supplied by the ADC 311, and making the calculations of Rsense and $R_{parasitic}$. Such software can be stored in NVM 221 with the results stored in SRAM 223 (or other storage locations). The measurement sequence starts in 350 by turning on current source 301 and transistor 105 (if not already on) and closing switch 307 and opening switch 308 to cause current $I_1$ to be injected at the drain terminal 306 with no load on the port. In 352, the differential amplifier 309 measures the first voltage and the ADC 311 supplies the first measured voltage to the microcontroller directly or by storing the first measured voltage in a designated storage location. Next in 354, the control sequence causes the $I_1$ current source to be turned off and the $I_2$ current source 303 to be turned on. In an embodiment, instead of a separate $I_2$ current source 303 being turned on, another $I_1$ current source 303 is turned on along with the $I_1$ current source 301 to provide for a current of $2I_1$. In step 356, the second voltage across the sense resistor is measured and the result is supplied to the microcontroller 115 or otherwise stored. In 358 the current source(s) are turned off and in 360 the first resistance is calculated as $$R_{sense1} = \frac{\Delta V}{\Delta I},$$

where $\Delta I$ is known.

Next the second resistance measurement is made using a different current path, namely current injection at the source terminal 320. The second measurement sequence starts in 362 by turning off transistor 105, opening switch 307, closing switch 308, and injecting current at the source terminal 320. In 364, the differential amplifier 309 measures the third voltage across the sense resistor and the ADC 311 supplies the third measured voltage to the microcontroller directly or by storing the first measured voltage in a designated storage location. Next in 366, the control sequence turns off the current source 301 supplying $I_1$ and turns on the current source 303 supplying $I_2$. In step 368, the fourth voltage across the sense resistor is measured and the result is supplied to the microcontroller 115 or otherwise stored. In 370 the current source(s) are turned off and in 372 the resistance is calculated as $$R_{sense2} = \frac{\Delta V}{\Delta I},$$

where $\Delta I$ is known. Finally, the microcontroller calculates the Rparasitic=$R_{sense2}-R_{sense1}$ in 374 and stores the measurement of the parasitic for use in future measurements of Rsense. Of course, the two resistance measurements can be stored instead of the value of the parasitic resistance. During operation, knowing the parasitic resistance allows the PSE to make more accurate power measurements and thereby supply the maximum amount of power permitted. Note that the order of some of the steps shown in FIG. 3B can be changed. For example, the calculations can be performed after all the measurements have been completed and injection can occur at the source before injection at the drain.

Figure 3C:
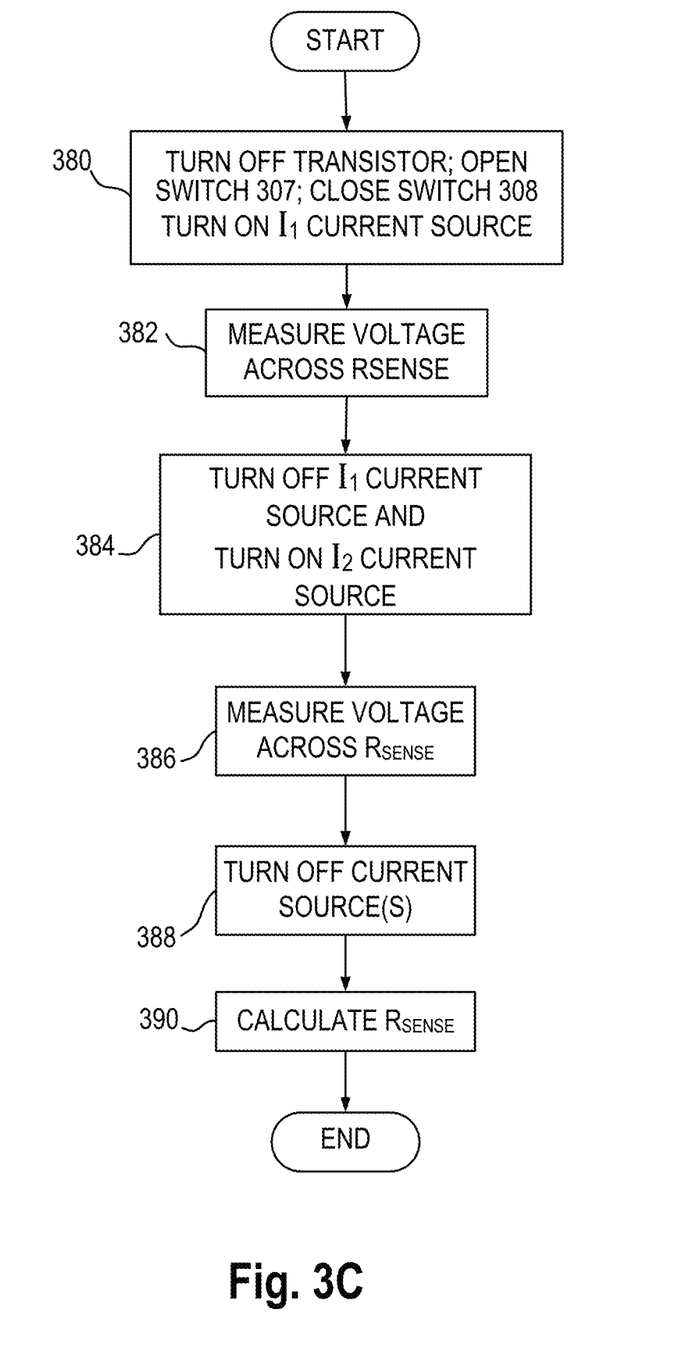
FIG. 3C illustrates a high level control flow of an embodiment of a calibration system that determines the resistance value of the sense resistor using two injections at the source.

FIG. 3C illustrates the control sequence to determine the resistance value of sense resistor 103 in the embodiment of FIG. 3A using a two point injection of currents at the source terminal 320 during runtime on the PSE. The measurement sequence starts in 380 by isolating the port 101 from Rsense by turning transistor 105 off, ensuring switch 307 is open, and closing switch 308 to cause the current $I_1$ to be injected at the source terminal 320. In 382, the differential amplifier 309 measures the first voltage and the ADC 311 supplies the first measured voltage to the microcontroller directly or by storing the first measured voltage in a designated storage location. Next in 384, the control sequence causes the $I_1$ current source 301 to be turned off and the $I_2$ current source 303 to be turned on. In step 386, the second voltage across the sense resistor is measured and the result is supplied to the microcontroller 115 or otherwise stored. In 388 the current source(s) are turned off and in 390 the resistance is calculated as $$R_{sense2} = \frac{\Delta V}{\Delta I},$$

where ΔI is known as described earlier. Together with Rsense1 and Rsense2 measurements made during board testing to determine the parasitic resistance, changes in Rsense during the life of the product can be accounted for by only measuring Rsense2 operationally and subtracting out the parasitic resistance. As described earlier, the parasitic resistance measured at board testing may be adjusted by the percentage change in operational Rsense2 from the board testing value of Rsense2.

Figure 4:
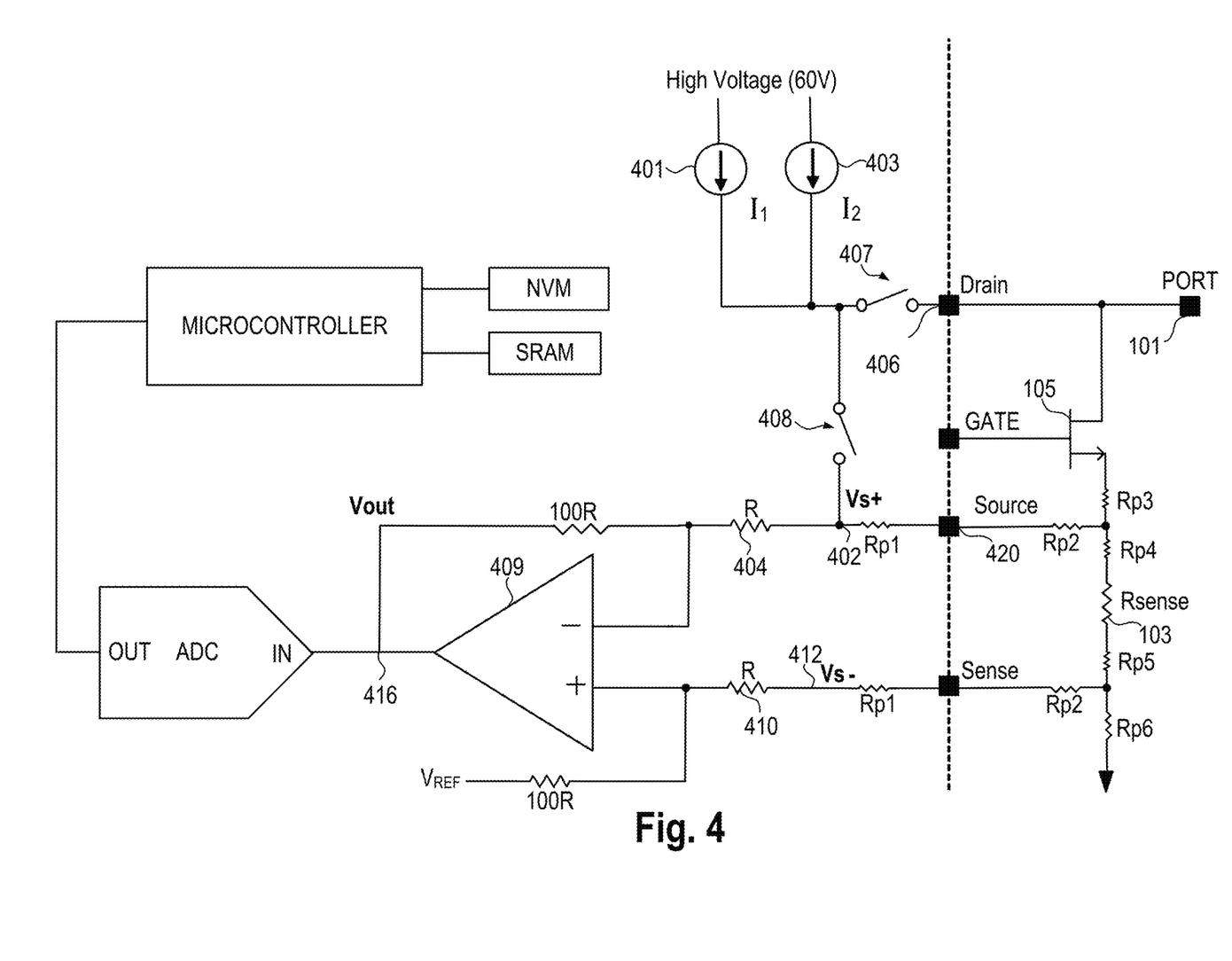
FIG. 4 illustrates the additional details about the parasitic resistances associated with measuring the sense resistor.

FIG. 4 illustrates the additional details about the calibration operation illustrated in FIGS. 3A and 3B showing the locations of parasitic resistances. Assuming the current $I_1$ is injected on the drain terminal 406, and assuming the resistance R 404>>Rsense, the Vs+ input at node 402 is $Vs+=I\times(Rp4+Rsense+Rp5+Rp6)$, where Rpn are various parasitic resistances shown in FIG. 4A and I is the current $I_1$ from current source 401. The $V_{s-}$ input to the differential amplifier circuit at node 412 is $Vs-=I\times(Rp6)$, also assuming the resistance R 410>>Rsense.

$Vout_1$ (using the current source supplying $I_1$) at node 416 of the differential amplifier 409 can be calculated as $Vout_1 \cong V_{REF} - 100(I_1\times(Rp4+Rsense+Rp5)+Vos)$.

The voltage measurement is repeated for $I=I_2$ from the current source 403.

$Vout_2 \cong V_{REF} - 100(I_2\times(Rp4+Rsense+Rp5)+Vos)$.

ΔVout=100(ΔI×(Rp4+Rsense+Rp5)), where ΔI is the difference between the currents $I_1$ and $I_2$ and ΔVout is the difference in the two voltage measurements $Vout_1$ and $Vout_2$. Thus, $(Rp4+Rsense+Rp5)=\Delta Vout/(100\Delta I)$.

Then the switch 407 is opened and the switch 408 closed. The transistor 105 is turned off. Current from the two current sources is sequentially injected on the source terminal 420 resulting in (for the $I_1$ current injection):

$Vs+=I_1\times(Rp1+Rp2+Rp4+Rsense+Rp5+Rp6)$, $Vs-=I_1\times(Rp6)$, $Vout_1 \cong V_{REF} - 100(I_1\times(Rp1+Rp2+Rp4+Rsense+Rp5)+Vos)$, The voltage measurement is repeated for $I_2$ from the current source 403 and $Vout_2 \cong V_{REF} - 100(I_2\times(Rp1+Rp2+Rp4+Rsense+Rp5)+Vos)$, ΔVout=100(ΔI×(Rp1+Rp2+Rp4+Rsense+Rp5)), where $\Delta I=I_2-I_1$+ and $\Delta Vout=Vout_1-Vout_2$; and $(Rp1+Rp2+Rp4+Rsense+Rp5)=\Delta Vout/(100\Delta I)$ Using the drain measured resistance value, the parasitic resistance can be determined from, (Rp1+Rp2+Rp4+Rsense+Rp5)−(Rp4+Rsense+Rp5)= (Rp1+Rp2).

Microcontroller 115 (or other control logic), controls the switches and current sources, makes the calculations described and stores the parasitic resistance value along with the value of (Rp4+Rsense+Rp5) in memory if needed. The parasitic resistance value can be used during operation of the PSE to more accurately determine power being supplied to the load. The source injection measurements can be repeated during operation to ensure that accurate resistance values are maintained to compensate for, e.g., temperature changes or other resistance drift.

Figure 5A:
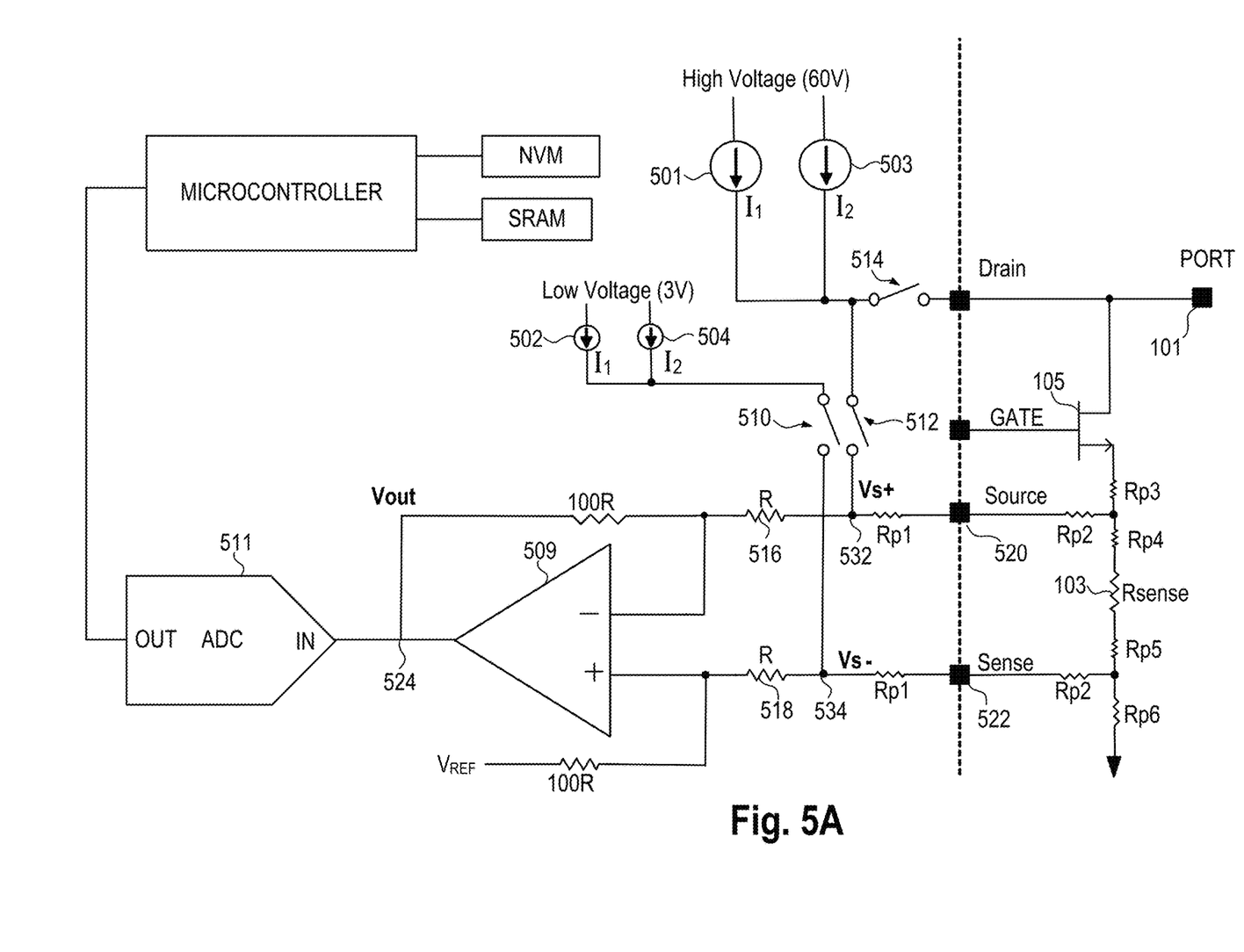
FIG. 5A illustrates an embodiment in which current is injected on the source terminal and the sense terminal simultaneously to measure the sense resistor.

FIG. 5A illustrates another embodiment in which current is injected on the source terminal 520 and the sense terminal 522 simultaneously. With reference to FIG. 5A, with switches 510 and 512 closed, and switch 514 open, current sources 501 and 502 simultaneously supply current to the source terminal 520 and the sense terminal 522, respectively. That results in the Vs+ input at node 532 being $Vs+==I_1\times(Rp1+Rp2+Rp4+Rsense+Rp5+2\times Rp6)$, where Rpn are the various parasitic resistances shown in FIG. 5A and $I_1$ is the current from current source 501. The $V_{s-}$ input at node 534 is $Vs-=I_1\times(Rp1+Rp2+2\times Rp6))$, where $I_1$ is the current from the current source 502. The current sources are assumed to be well matched and supply equal $I_1$ currents but in embodiments, the current sources are measured, e.g., in production test and the current values are stored in non-volatile memory. That way any differences in the current sources can be accounted for during the voltage calculations.

It is assumed that the resistances R 516 and 518>>Rsense. Vout at node 524 for the $I_1$ current sources can be calculated as $Vout_1 \cong V_{REF} - 100(I_1\times(Rp4+Rsense+Rp5)+Vos)$ The voltage measurement is repeated with current source 503 and 504 simultaneously supplying the current $I_2$ to the source node 520 and the sense node 522, respectively. $Vs+=I_2\times(Rp1+Rp2+Rp4+Rsense+Rp5+2\times Rp6)$, where Rpn are the various parasitic resistances shown in FIG. 5A and $I_2$ is the current from current source 503. The Vs− input at node 534 is $Vs-=I_2\times(Rp1+Rp2+2\times Rp6))$, where $I_2$ is the current from the current source 504. The current sources are assumed to be well matched and supply equal $I_2$ currents but in embodiments, the current sources are measured, e.g., in production test and the current values are stored in NVM. That way any differences in the current sources can be accounted for during the voltage calculations.

It is assumed that the resistances R 516 and 518>>Rsense. Vout at node 524 for the $I_2$ current sources can be calculated as $Vout_2 = V_{REF} - 100(I_2\times(Rp4+Rsense+Rp5)+Vos)$ Again, the current sources are assumed to be well matched and supply equal $I_2$ currents but in embodiments the values of the current sources are measured during production test and stored in NVM for use during sense resistor measurement. Mismatch in the current sources can be compensated for digitally or as described further herein. With two voltage measurements made from the two pairs of current sources, ΔVout=100(ΔI×(Rp4+Rsense+Rp5), where ΔVout=($Vout_2$−$Vout_1$) and ΔI is the difference in the currents ($I_2$−$I_1$). Thus, the resistance used for a current measurement to determine if the power supplied to the load is within appropriate limits is given by, (Rp4+Rsense+Rp5)=ΔVout/(100ΔI). While Rp4 and Rp5 and parasitic resistances, those resistances are part of the sense resistance and thus when measuring the voltage across the sense resistance, the parasitic resistances Rp4 and Rp5 are necessarily present and considered part of Rsense for measurement purposes. While switch 514 is shown in the embodiment of FIG. 5A, other embodiments omit the switch.

The topology shown in FIG. 5A turns both $V_{os}$ and the parasitic resistances Rp1 and Rp2 into a common mode signal. That is effective within the matching of the currents and assuming that Rp1 and Rp2 in the upper and lower legs are also well matched. This is effective if:

$$\Delta I \text{ mismatch} \times (Rp1+Rp2) \ll R\text{sense, and} \quad (1)$$

$$Rp1\text{mismatch}+Rp2\text{mismatch} \ll R\text{sense.} \quad (2)$$

Both conditions are met when (Rp1+Rp2)≪Rsense. That suggests that mismatch of the current sources and Rp should be minimized to the extent possible.

Figure 5B:
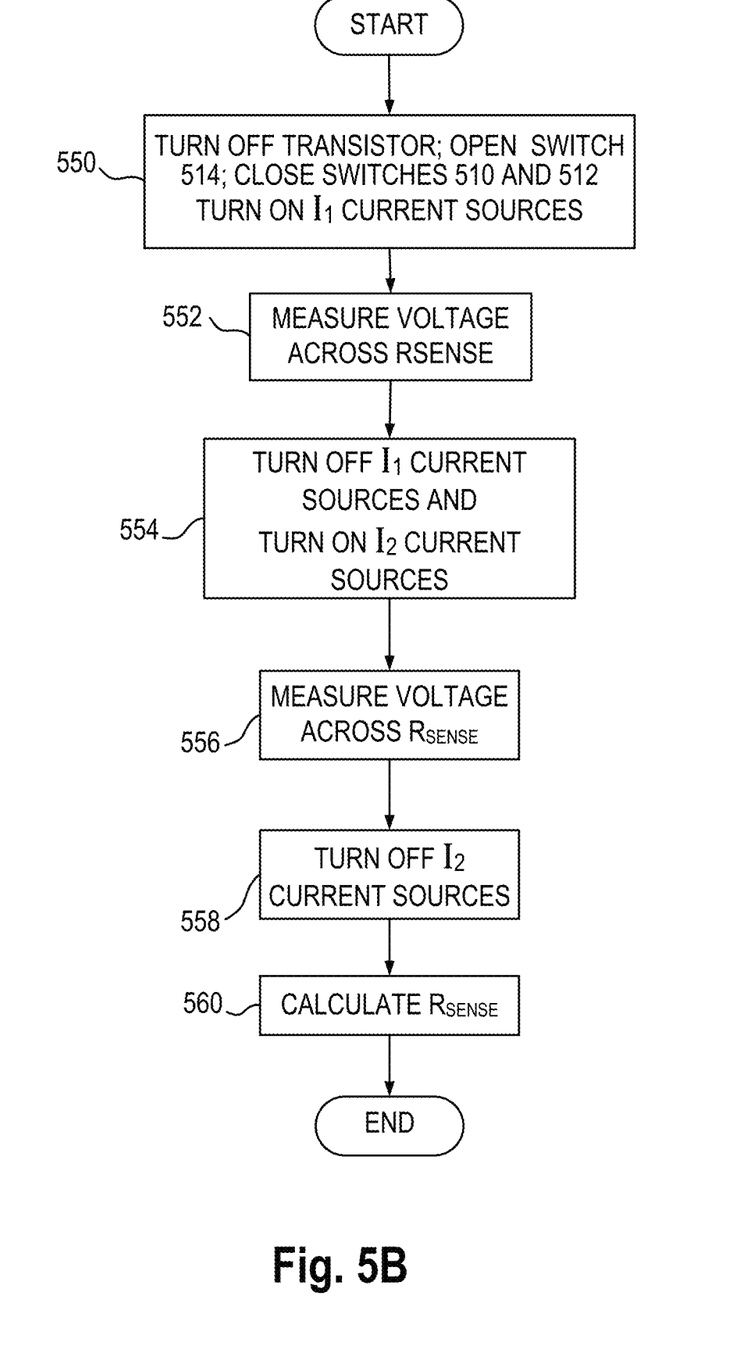
FIG. 5B illustrates a high level control flow of an embodiment of a calibration system that determines the resistance of the sense resistor using simultaneous current injections at both nodes of the sense resistor.

FIG. 5B illustrates the control sequence to determine the resistance value of sense resistor 103 in the embodiment of FIG. 5A by injecting currents simultaneously at the source terminal 520 and the sense terminal 522 during the voltage measurements. The measurement sequence starts in 550 ensuring transistor 105 is off, opening switch 514 and closing switches 510 and 512 to cause current $I_1$ from current source 501 to be injected at the source terminal 520 and the $I_1$ current from current source 502 to be injected at the same time at the sense terminal 522 during the voltage measurement. In 552, the differential amplifier 509 measures the first voltage and the ADC 511 supplies the first measured voltage to the microcontroller directly or by storing the first measured voltage in a designated storage location. Next in 554, the control sequence causes the $I_1$ current sources to be turned off and the $I_2$ current sources 503 and 504 to be turned on to inject the $I_2$ current at source terminal 520 and at the same time inject an $I_2$ current at the sense terminal 522 during the voltage measurement. In step 556, the second voltage across the sense resistor is measured and the result is supplied to the microcontroller 115 or otherwise stored. In 558 the current sources are turned off and in 560 the resistance is calculated as $R_{sense}=\Delta V/\Delta I$, where $\Delta I$ is known. The order of certain of the steps shown in FIG. 5B can be changed such as measuring the voltage resulting from the $I_2$ current sources first. The embodiment(s) described by FIGS. 5A and 5B can be used operationally to periodically measure Rsense (with transistor 105 off) and account for changes in Rsense over time.

Figure 6:
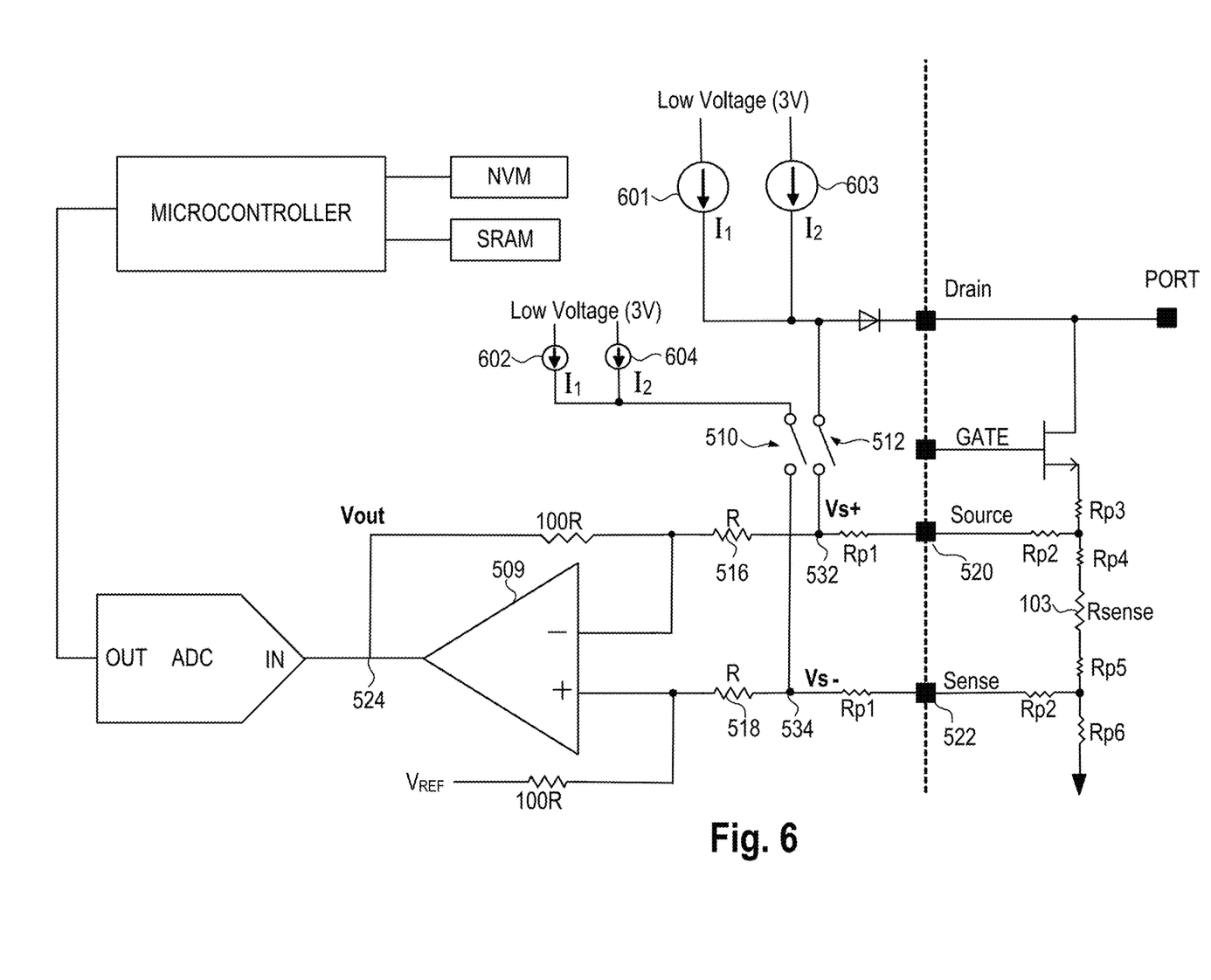
FIG. 6 illustrates an embodiment in which the current sources are all in a low voltage domain.

FIG. 6 illustrates an embodiment in which the current sources 601, 602, 603, and 604 are all in a low voltage domain (e.g., 3V) as opposed to the embodiment of FIG. 5A in which current sources 501 and 503 are in a high voltage domain (e.g., 60 V). That allows better matching of the two current sources and also provides for lower power consumption. $I_1$ and $I_2$ in the various embodiments shown herein, e.g., in FIGS. 2A, 3A, 4, 5A, 6, 7A, and 7B should have sufficient current scaling between them. For example, in embodiments, $I_1$ is 20 mA and $I_2$ is 40 mA but other embodiments use different currents that are appropriate for the particular application.

Figure 7A:
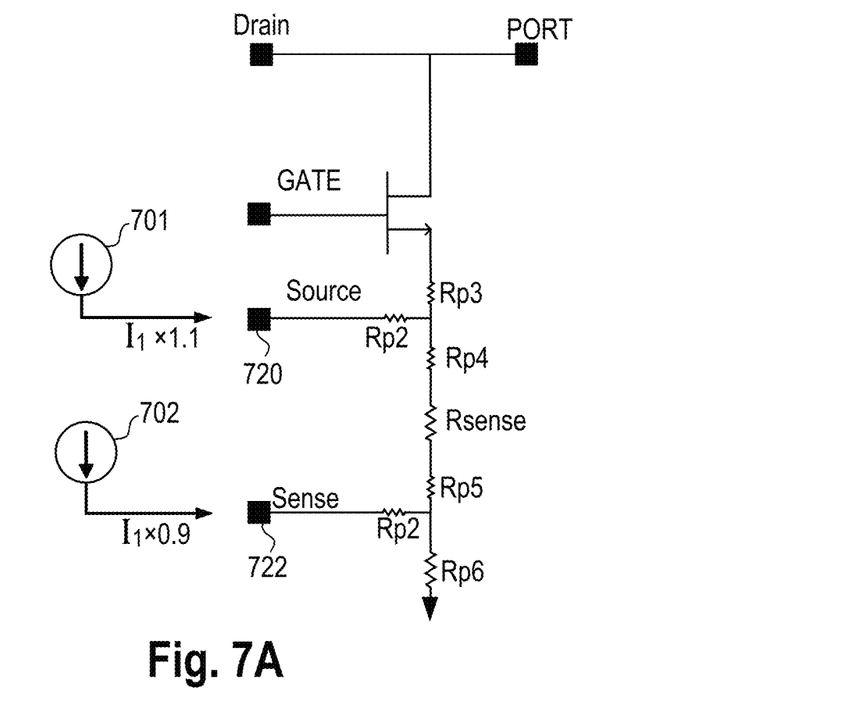
FIGS. 7A and 7B illustrates an embodiment that addresses current mismatch in the current sources by swapping current sources for simultaneous measurements.
Figure 7B:
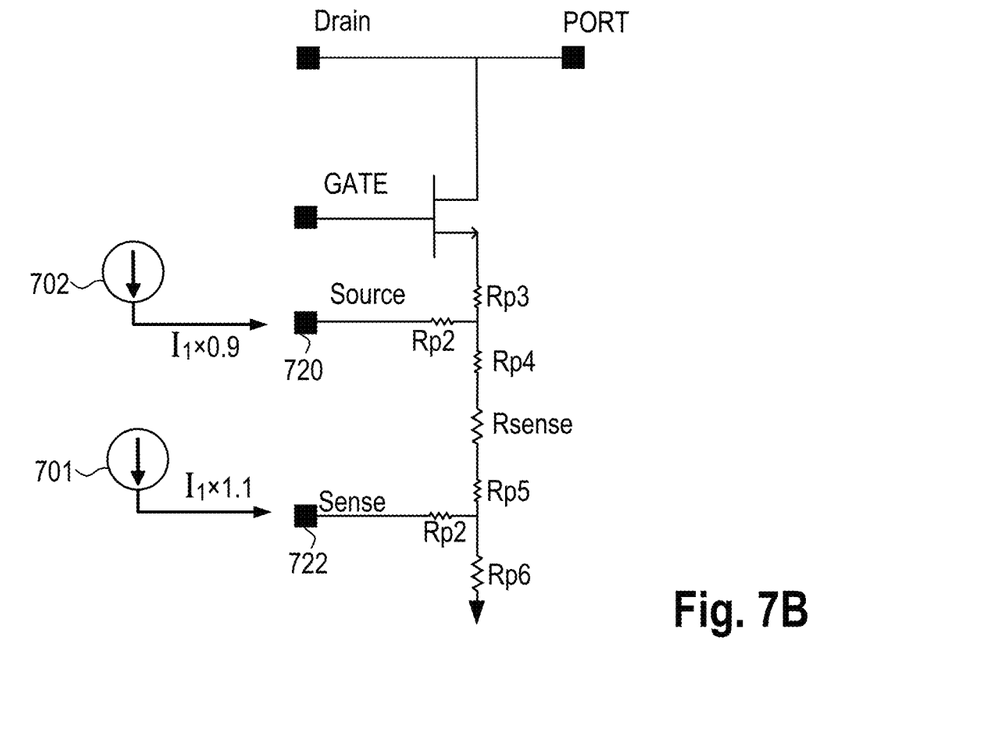

In order to address current mismatch in the current sources, an embodiment swaps the current sources that are coupled to the source and sense terminals during measurements and the measurements are averaged. Referring to FIGS. 7A and 7B assume the calibration current $I_1$ from current sources 701 and 702 have a nominal value of $I_1$ and differ by 10 percent from the nominal value. The first voltage measurement supplies the current $I_1 \times 1.1$ from current source 701 to the source terminal 720 and supplies the current $I_1 \times 0.9$ from current source 703 to the sense terminal 722. Injection on the source terminal 720 from current source 701 results in $$V\text{source}=I_1\times[1.1\times(Rp2+Rp4+R\text{sense}+Rp5+Rp6)+(0.9\times Rp6)].$$

Injection on the sense terminal 722 from current source 702 results in $$V\text{sense}=I_1\times[0.9\times(Rp2+Rp6)+(1.1\times Rp6)].$$

$$V\text{source}-V\text{sense}=I_1\times[1.1\times(Rp4+R\text{sense}+Rp5)+(0.2\times Rp2)]$$

The current sources are then swapped through additional switches not shown and for the second voltage measurement current source 702 supplies the current $I_1 \times 0.9$ to the source terminal 720 and current source 701 supplies the current $I_1 \times 1.1$ to the sense terminal 722. For the second voltage measurement, injection on the source terminal from current source 702 results in $$V\text{source}=I_1\times[0.9\times(Rp2+Rp4+R\text{sense}+Rp5+Rp6)+(1.1\times Rp6)],$$

Injection at the sense terminal from current source 701

$$V\text{sense}=I_1\times[1.1(Rp2+Rp6)+(0.9\times Rp6)],$$

$$V\text{source}-V\text{sense}=I_1\times[0.9\times(Rp4+R\text{sense}+Rp5)-(0.2\times Rp2)]$$

In order to address the current mismatch, the two voltage measurements are averaged resulting in, $$\text{Average}(V\text{source}-v\text{sense})=I_1\times(Rp4+R\text{sense}+Rp5).$$

The voltage measurements are then repeated for the current sources supplying $I_2$ (not shown in FIGS. 7A and 7B) and averaged in the same manner as for $I_1$.

Note that averaging has no impact on Rp2 mismatch, so for a 1% calibration Rp2 should be matched, e.g., within 1 mOhm. For ease of illustration, Rp1 was omitted from FIGS. 7A and 7B. Any difference in bondwire length or other known mismatch can be compensated for digitally in computing the resistance value of the sense resistor.

Measuring the resistance of Rsense using the source path (after having previously made the drain path injection) or measuring by injecting simultaneously at the source and sense nodes, allows a load to be on the port terminal during measurements. That assumes that the external load does not change during the measurements. Given the POE environment, the external load should generally be stable. Of course, measurements can be made injecting at the source terminal with transistor 105 off or by injecting at the source and sense terminals simultaneously with transistor 105 off. An accurate resistance measurement can then be used to accurately measure power being supplied to the load by measuring the voltage across the sense resistor.

Thus, various aspects of a calibration system to measure the resistance value of a sense resistor in a POE environment. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A calibration circuit comprising:
   a transistor;
   a first current path including a transistor;
   a second current path that bypasses the transistor;
   a sense resistor;
   an amplifier coupled to a first node and a second node of the sense resistor to provide an indication of voltage across the sense resistor; and
   control logic configured to: while the transistor is on, perform a first resistance measurement of the sense resistor using the first current path; cause the transistor to turn off after perform the first resistance measurement; while the transistor is off, perform a second resistance measurement of the sense resistor using the second current path; and determine parasitic resistance in the second current path based on the first resistance measurement and the second resistance measurement.

2. The calibration circuit of claim 1 further comprising a microcontroller implementing the control logic.

3. The calibration circuit of claim 1 wherein the control logic is further configured to cause a first current from a first current source to be injected at a first current carrying node of the transistor, and to cause a second current from a second current source at the first current carrying node of the transistor.

4. The calibration circuit of claim 1 wherein, to perform the first resistance measurement, the control logic is configured to:
   cause a first current at a first current carrying node of the transistor and measure a first voltage;
   cause a second current at the first current carrying node of the transistor and measure a second voltage; and
   determine the first resistance measurement based on a voltage difference between the first voltage and the second voltage and a current difference between the first current and the second current.

5. The calibration circuit of claim 4 wherein, to perform the second resistance measurement, the control logic is configured to:
   cause the first current to be injected at an input to an amplifier and measure a third voltage;
   cause the second current to be injected at an input to the amplifier and measure a fourth voltage; and
   determine the second resistance measurement based on a voltage difference between the third voltage and the fourth voltage and a current difference between the first current and the second current.

6. A calibration circuit comprising:
   a transistor;
   a sense resistor;
   an amplifier coupled to a first node and a second node of the sense resistor to provide an indication of voltage across the sense resistor; and
   control logic configured to: record a first voltage across the sense resistor measured by the amplifier while a first current is applied to a first node of the sense resistor and a second current is applied to a second node of the sense resistor, measure a second voltage across the sense resistor measured by the amplifier during a second time while a third current is applied to the first node of the sense resistor and a fourth current is applied to the second node of the sense resistor, and determine a resistance value of the sense resistor based at least in part, on a difference between the first voltage and the second voltage, and a current difference between the first current and the third current.

7. The calibration circuit of claim 6 further comprising a microcontroller implementing the control logic.

8. The calibration circuit of claim 6 wherein the first current and the second current are nominally equal and the third current and the fourth current are nominally equal and the first current and the third current are different.

9. The calibration circuit of claim 6 wherein the control logic is further configured to periodically measure the resistance value with a transistor turned on, the transistor having a first current carrying node coupled to a port to which a load is attached and having a second current carrying node coupled to the first node of the sense resistor.

10. The calibration circuit of claim 6 wherein the control logic is further configured to periodically measure the resistance value with a transistor turned off, the transistor having a first current carrying node coupled to a port to which a load is attached and a second current carrying node coupled to the first node of the sense resistor.

11. The calibration circuit of claim 6 wherein the control logic is further configured to use the resistance value to determine power being provided to a load through a port coupled to the sense resistor.

12. A method of determining a parasitic resistance comprising:
   while a transistor is on, performing a first resistance measurement of a sense resistor using a first current path, the first current path including the transistor;
   turning the transistor off after making the first resistance measurement;
   performing a second resistance measurement of the sense resistor with the transistor off using a second current path that bypasses the transistor; and
   determining parasitic resistance in the second current path based on the first resistance measurement and the second resistance measurement.

13. The method of claim 12 wherein performing the first resistance measurement includes:
   injecting a first current at a first current carrying node of the transistor and measuring a first voltage;
   injecting a second current at the first current carrying node of the transistor and measuring a second voltage; and
   determining the first resistance measurement based on a voltage difference between the first voltage and the second voltage and a current difference between the first current and the second current.

14. The method of claim 12 wherein performing the first resistance measurement includes:
   injecting a first current from a first current source at a first current carrying node of the transistor; and
   injecting a second current from a second current source at the first current carrying node of the transistor.

15. The method of claim 13 wherein performing the second resistance measurement includes:
   injecting the first current at an input to an amplifier and measuring a third voltage;
   injecting the second current at an input to the amplifier and measuring a fourth voltage; and
   determining the second resistance measurement based on a voltage difference between the third voltage and the fourth voltage and a current difference between the first current and the second current.

16. A method of determining a sense resistor value, comprising:
   measuring a first voltage across a sense resistor while a first current is applied to a first node of the sense resistor and a second current is applied to a second node of the sense resistor;

measuring a second voltage across the sense resistor during a second time while a third current is applied to the first node of the sense resistor and a fourth current is applied to the second node of the sense resistor; and determining a resistance value of the sense resistor based at least in part on a difference between the first voltage and the second voltage, and a current difference between the first current and the third current.

17. The method of claim 16 further comprising using the resistance value to determine power being provided to a load through a port coupled to the sense resistor.

18. The method of claim 16 wherein the first current and the second current are nominally equal and the third current and the fourth current are nominally equal and the first current and the third current are different.

19. The method of claim 16 further comprising periodically determining the resistance value with a transistor turned on, the transistor having a first current carrying node coupled to a port to which a load is attached and having a second current carrying node coupled to the first node of the sense resistor.

20. The method of claim 16 further comprising periodically determining the resistance value with a transistor turned off, the transistor having a first current carrying node coupled to a port to which a load is attached and a second current carrying node coupled to the first node of the sense resistor.

* * * * *